United States Patent
Kim et al.

(10) Patent No.: US 9,196,340 B2
(45) Date of Patent: Nov. 24, 2015

(54) MAGNETIC RANDOM ACCESS MEMORY HAVING INCREASED ON/OFF RATIO AND METHODS OF MANUFACTURING AND OPERATING THE SAME

(71) Applicant: Samsung Electronics Co., Ltd., Suwon-Si, Gyeonggi-Do (KR)

(72) Inventors: Ho-jung Kim, Suwon-si (KR); Hyun-sik Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/080,108

(22) Filed: Nov. 14, 2013

(65) Prior Publication Data
US 2014/0233305 A1    Aug. 21, 2014

(30) Foreign Application Priority Data

Feb. 15, 2013    (KR) .......................... 10-2013-0016600

(51) Int. Cl.
| | |
|---|---|
| *G11C 11/00* | (2006.01) |
| *G11C 11/16* | (2006.01) |
| *H01L 43/08* | (2006.01) |
| *H01L 27/22* | (2006.01) |
| *G11C 11/15* | (2006.01) |
| *H01L 43/12* | (2006.01) |

(52) U.S. Cl.
CPC ............ *G11C 11/1675* (2013.01); *G11C 11/15* (2013.01); *G11C 11/1673* (2013.01); *H01L 27/228* (2013.01); *H01L 43/08* (2013.01); *H01L 43/12* (2013.01)

(58) Field of Classification Search
CPC ............... G11C 13/0004; G11C 11/56; G11C 13/0002; G11C 11/15; G11C 11/5678; G11C 13/0069; G11C 13/025; G11C 14/00
USPC .............. 365/148, 163, 158, 154, 171, 225.7, 365/149, 174, 182
See application file for complete search history.

(56) References Cited

U.S. PATENT DOCUMENTS

| | | | |
|---|---|---|---|
| 6,937,505 B2 | 8/2005 | Morikawa | |
| 2004/0141368 A1* | 7/2004 | Inaba | ............................ 365/158 |
| 2006/0067103 A1* | 3/2006 | Ferrant et al. | ................. 365/148 |

FOREIGN PATENT DOCUMENTS

| | | |
|---|---|---|
| KR | 2004-0016448 A | 2/2004 |
| KR | 2004-0066420 A | 7/2004 |
| KR | 2010-0011558 A | 2/2010 |
| KR | 2010-0099951 A | 9/2010 |

* cited by examiner

*Primary Examiner* — Thong Q Le
(74) *Attorney, Agent, or Firm* — Harness, Dickey & Pierce, P.L.C.

(57) ABSTRACT

A magnetic random access memory (MRAM), and methods of manufacturing and operating the MRAM, include a switching element and a storage node connected to the switching element, and a magnetic node configured to simultaneously store two opposite bits.

10 Claims, 7 Drawing Sheets

MAGNETIC RANDOM ACCESS MEMORY HAVING INCREASED ON/OFF RATIO AND METHODS OF MANUFACTURING AND OPERATING THE SAME

CROSS-REFERENCE TO RELATED APPLICATIONS

This application claims the benefit of priority under 35 U.S.C. §119 Korean Patent Application No. 10-2013-0016600, filed on Feb. 15, 2013 in the Korean Intellectual Property Office, the disclosure of which is incorporated herein in its entirety by reference.

BACKGROUND

1. Field

Example embodiments relate to a memory device and/or methods of manufacturing and operating the same, and more particularly, to a magnetic random access memory (MRAM) having an increased On/Off ratio and/or methods of manufacturing and operating the MRAM.

2. Description of the Related Art

A magnetic random access memory (MRAM) is a random access memory (RAM) that reads data written on a magnetic tunnel junction (MTJ) by measuring a resistance difference from magnetization states of a free layer and a pinned layer. A magnetization direction of the pinned layer is fixed. A magnetization direction of the free layer may change when a magnetic field having a set (or, predetermined) intensity is applied to the free layer. Also, a magnetization direction of the free layer may change depending on a spin state of an electric current flowing through the MTJ. A resistance measured when magnetization directions of the free layer and the pinned layer are the same is called an "on" resistance, and a resistance measured when magnetization directions of the free layer and the pinned layer are the opposite is called an "off" resistance. The MRAM may read data by using a difference between the "on" and "off" resistances. Therefore, when the difference between the "on" and "off" resistances in the MRAM is little, in other words, when an on/off ratio is small, a sensing margin decreases, thereby making read-data less reliable. Problems such as overlapping of cell distribution and array size reduction may occur as well. Especially, when the resistance increases as a degree of integration increases, the sensing margin may decrease more.

SUMMARY

Example embodiments relate to a magnetic random access memory (MRAM) that may increase a sensing margin.

Example embodiments provide methods of operating and manufacturing the MRAM.

According to some example embodiments, a magnetic random access memory includes a switching element, and a storage node connected to the switching element. The storage node includes a magnetic node configured to simultaneously store two opposite bits.

The switching element may be a field effect transistor, and the field effect transistor may include a source shared by a neighboring field effect transistor.

The storage node may include a first magnetic tunnel junction (MTJ) and a second magnetic tunnel junction (MTJ).

The first and second MTJs may be sequentially stacked and independent from each other.

The first and second MTJs may have a same stack structure.

A free layer and a pinned layer of the first MTJ may be configured to have a same magnetization direction based on a first current applied to the first MTJ, and a free layer and a pinned layer of the second MTJ may be configured to have opposite magnetization directions based on a second current applied to the second MTJ when the first current and the second current are applied simultaneously.

The MRAM may further include two bit lines connected to the storage node, wherein the storage node is between the two bit lines.

According to other example embodiments, a method of operating a magnetic random access memory includes applying an operational current to a magnetic node of the MRAM through two different paths, wherein the MRAM includes a switching element, and a storage node connected to the switching element and including the magnetic node. The magnetic node is configured to store opposite first and second bit data.

The operational current may be a writing current for writing data on the magnetic node.

The operational current may be a reading current for reading data from the magnetic node.

The storage node may include a first magnetic tunnel junction (MTJ) and a second magnetic tunnel junction (MTJ) sequentially stacked and independent from each other. The applying of the operational current to the magnetic node of the MRAM may include applying a first current in a first direction through the first MTJ, and applying a second current in a second direction through the second MTJ where the first direction is opposite to the second direction.

Two bit lines may be connected to the storage node, and the operational current may be applied simultaneously through the two different paths.

According to further example embodiments, a method of manufacturing a magnetic random access memory includes forming a switching element on a substrate, forming a storage node connected to the switching element, wherein the storage node is configured to storing opposite first and second bit data, and forming first and bit lines each connected to the storage node.

The forming of the storage node may include forming a first magnetic tunnel junction (MTJ) configured to storing one of the first and second bit data, forming a conductive pad layer on the first MTJ, wherein the conductive pad layer is connected to the switching element, and forming a second MTJ on the conductive pad layer, wherein the second MTJ is configured to store the other of the first and second bit data.

One of the first and second bit lines may be under the first MTJ, and the other may be over the second MTJ.

The method may further include forming a wire connected to the switching element between the first and second bit lines.

The method may further include forming a wire connected to the switching element under the first and second bit lines.

The first and second MTJs may be formed to have a same stack structure.

According to yet further example embodiments, an MRAM is provided with two MTJs stacked in a unit cell. Data is read by measuring a resistance difference between the two stacked MTJs. Thus, a sensing margin which is two times greater than that in a conventional measuring method of using an On/Off resistance difference of one MTJ is earned. Also, since the two MTJs are vertically stacked, the sensing margin may be earned without increasing an area of the MRAM.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

A magnetic random access memory (MRAM) according to example embodiments will be explained with reference to FIGS. 1 and 2.

Figure 1:
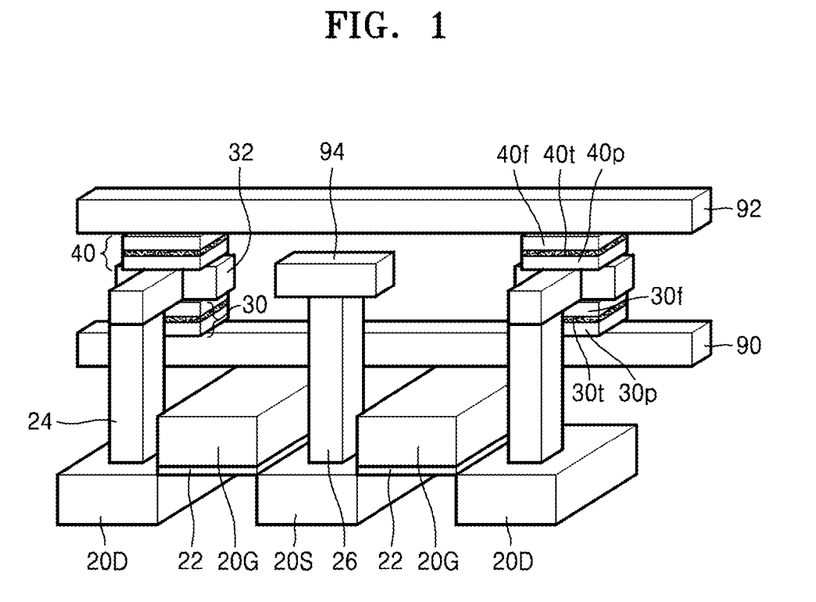
FIG. 1 is a perspective view illustrating a structure of a magnetic random access memory (MRAM) according to some example embodiments.

FIG. 1 is a perspective view illustrating a structure of the MRAM according to some example embodiments.

Referring to FIG. 1, a drain 20D and a source 20S are disposed under a gate stack structure 22+20G. The source 20S and the drain 20D are separated apart from each other, and the gate stack structure 22+20G is disposed between the source 20S and the drain 20D. The gate stack structure 22+20G may be obtained by sequentially stacking a gate insulating film 22 and a gate electrode 20G. The gate electrode 20G, the source 20S, and the drain 20D may be provided linearly. The gate electrode 20G, the source 20S, and the drain 20D may constitute a transistor. The transistor is simply an example of a switching element, and another switching element other than the transistor may be provided. First and second wires 90 and 92 are provided above the gate electrode 20G such that the first and second wires 90 and 92 intersect the gate electrode 20G. The first and second wires 90 and 92 may be first and second bit lines. Between the first and second wires 90 and 92, a first magnetic tunnel junction (MTJ) 30, a conductive pad layer 32, and a second MTJ 40 are stacked sequentially. The second MTJ 40 may be provided right above the first MTJ 30. The first and second MTJs 30 and 40 are vertically stacked as a three-dimensional structure, not adding (or, increasing) any area of a memory cell while providing the first and second MTJs 30 and 40. The first and second MTJs 30 and 40 may constitute a storage node or a magnetic node, and the conductive pad layer 32 may be included in the storage node. The first MTJ 30 is provided on the first wire 90, and a pinned layer 30p of the first MTJ 30 may directly contact the first wire 90. The second MTJ 40 is located beneath the second wire 92, and a free layer 40f of the second MTJ 40 may directly contact the second wire 92. The first and second MTJs 30 and 40 are provided independently. The pad layer 32 contacts a free layer 30f of the first MTJ 30 and a pinned layer 40p of the second MTJ 40. The first and second MTJs 30 and 40 consist of pinned layers 30p and 40p, tunneling films 30t and 40t, and free layers 30f and 40f which are layered up sequentially. Layer compositions of the first and second MTJs 30 and 40 may be same. Opposite bits (data) may be written on the first and second MTJs 30 and 40. In other words, operational current, such as writing current, may be applied in opposite directions to the first and second MTJs 30 and 40 having the same layer composition. Accordingly, for example, if 1 (or 0) is written on the first MTJ 30, 0 (or 1) is written on the second MTJ. The pad layer 32 is connected to the drain 20D through a conductive plug 24. From a vertical perspective, a third wire 94 is provided between the first and second wires 90 and 92. The third wire 94 may be provided at the same height as the pad layer 32. The third wire 94 is connected to the source 20S through a conductive plug 26.

Figure 2:
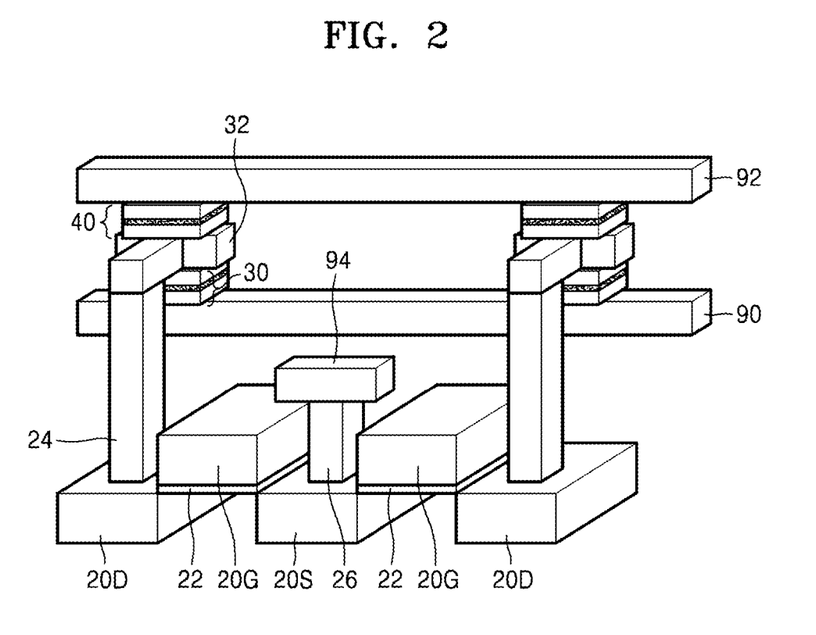
FIG. 2 is a perspective view illustrating the MRAM according to other example embodiments.

FIG. 2 is a perspective view illustrating the MRAM according other example embodiments. The following explanation will focus on a difference from the MRAM of FIG. 1.

Referring to FIG. 2, the third wire 94 is located differently from FIG. 1. In other words, the third wire 94 is provided at a lower level than the first wire 90. The source 20S is shared by two neighboring transistors in FIGS. 1 and 2.

Figure 3:
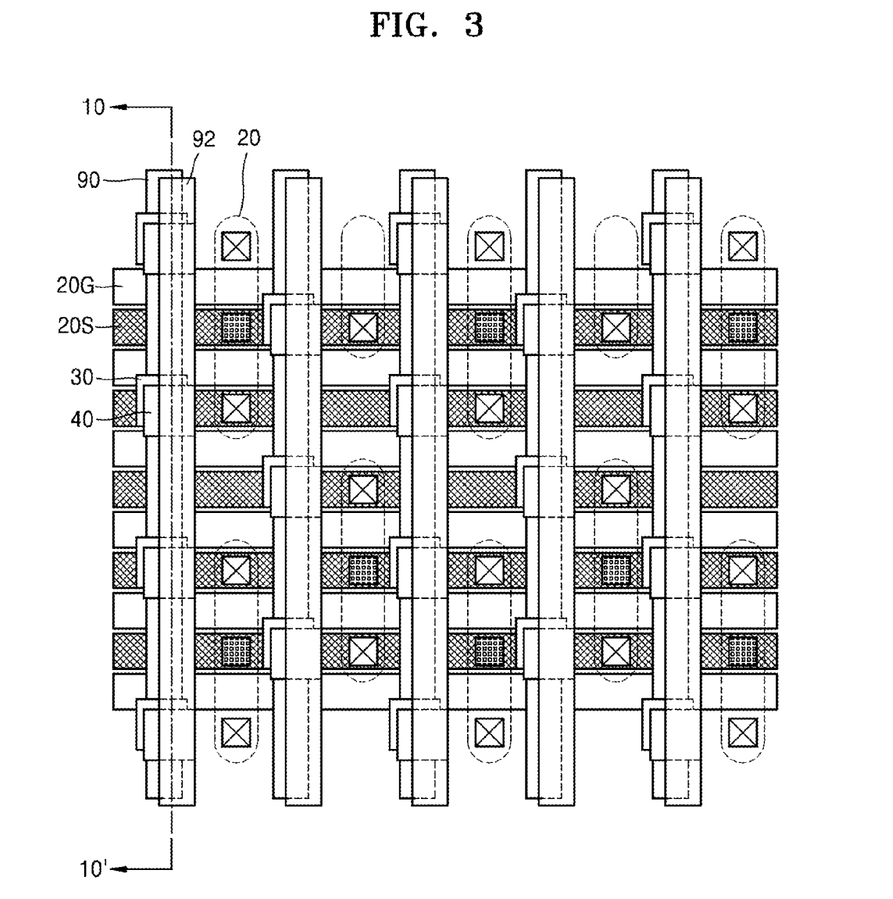
FIG. 3 is a cross-sectional view illustrating a layout of a memory including the MRAM of FIG. 1 or 2.

FIG. 3 is a cross-sectional view illustrating a layout of a memory including the MRAM of FIG. 1 or 2.

Referring to FIG. 3, the first and second wires 90 and 92 (the first and second bit lines) are perpendicularly intersecting with the gate electrode 20G (a word line). The gate electrode 20G and the source 20S (a source line) are parallel to each other. Reference numeral 20 in FIG. 3 denotes the two neighboring transistors. The two neighboring transistors share the source 20S.

Figure 4:
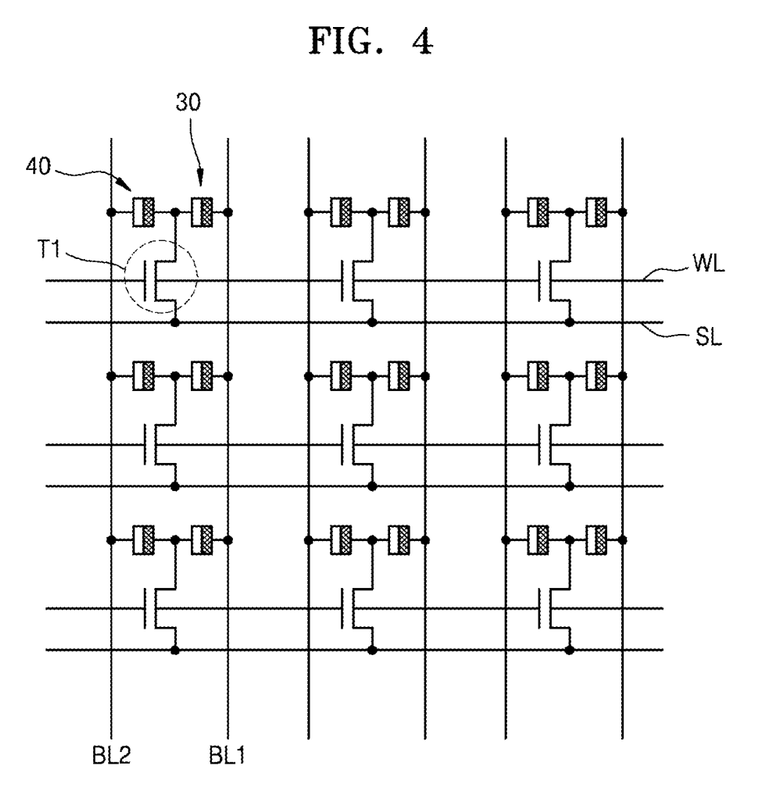
FIG. 4 is a circuit diagram illustrating a cell array of the MRAM according to some example embodiments.

FIG. 4 is a circuit diagram illustrating a cell array of the MRAM according to some example embodiments.

Referring to FIG. 4, multiple transistors T1 are arrayed in a matrix. For each transistor T1, a source is connected to a source line SL, and a gate is connected to a word line WL. Each transistor T1 is provided with two MTJs 30 and 40. The two MTJs 30 and 40 are separated from each other. A drain of the transistor T1, located between the two MTJs 30 and 40, is connected to the two MTJs 30 and 40 on each side. Out of the two MTJs 30 and 40, the first MTJ 30 is connected to a first bit line BL1, and the second MTJ 40 to a second bit line BL2.

Methods of operating the MRAM according to some example embodiments will be explained with reference to FIGS. 5 and 6.

Figure 5:
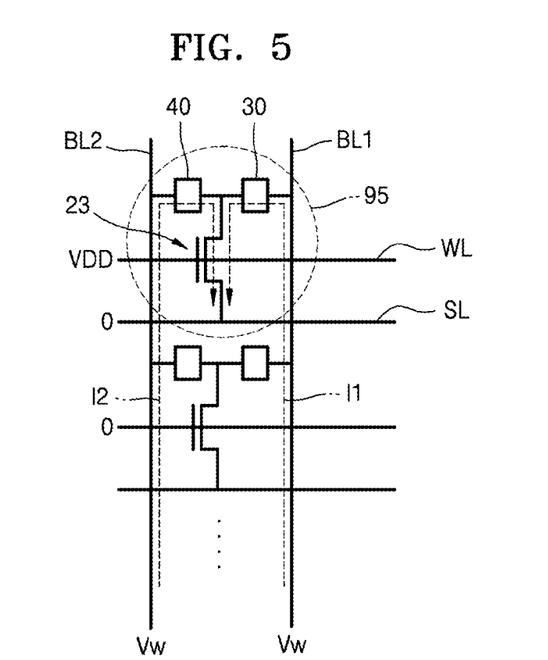
FIG. 5 is a circuit diagram of an array for explaining a writing method of the MRAM according to some example embodiments.

FIG. 5 is a circuit diagram illustrating an array for explaining a first recording method (a first writing method) of the MRAM. FIG. 5 illustrates only two unit memory cells for convenience.

Referring to FIG. 5, a potential difference is created between the source line SL and the bit lines BL1 and BL2 that are connected to a memory cell selected to record data. In other words, 0V is applied to the source line SL and a first writing voltage, Vw, is applied to the first and second bit lines BL1 and BL2. Also, a driving voltage, $V_{DD}$, is applied to the word line WL that is connected to the transistor 23 of the selected memory cell 95, thereby making the transistor into a turn-on state. Accordingly, first and second electric currents I1 and I2 flow from the first and second bit lines BL1 and BL2, past the first and second MTJs 30 and 40 and the transistor 23, to the source line SL. The amount of the first electric current I1 flowing through the first MTJ 30 may be the same as that of the second electric current I2 flowing through the second MTJ 40. However, the first and second electric currents I1 and I2 flowing through the first and second MTJs 30 and 40 are running in opposite directions. Because the first and second electric currents I1 and I2 run in opposite directions while the first and second MTJs 30 and 40 have the same layer composition, the opposite bit data may be written on the first and second MTJs 30 and 40. For example, due to the first electric current I1, the free layer and the pinned layer of the first MTJ 30 may have the same magnetization direction. In this case, the first MJT 30 has a relatively low resistance (bit data 1). Contrarily, due to the second electric current I2, the free layer and the pinned layer of the second MTJ 40 may have opposite magnetization directions. In this case, the second MTJ has a relatively high resistance (bit data 0). The relatively low resistance of the first MTJ 30 may be regarded as having recorded the bit date "1" (or "0"). The relatively high resistance of the second MTJ 40 may be regarded as having recorded the bit date "0" (or "1").

Figure 6:
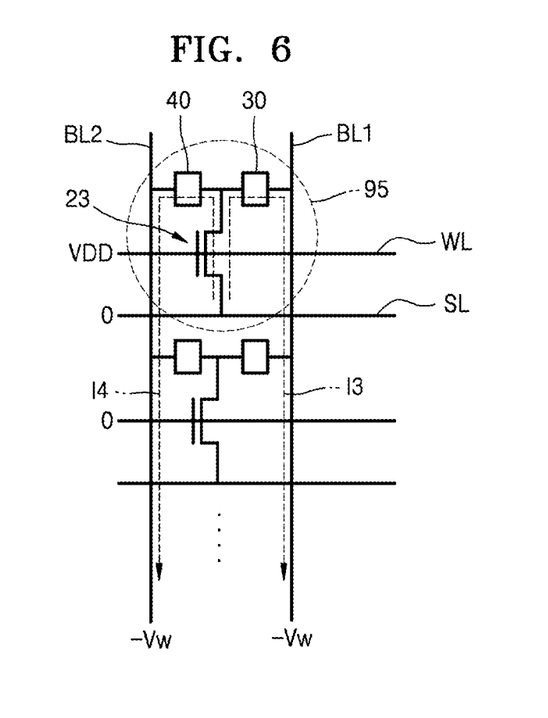
FIG. 6 is a circuit diagram of an array for explaining a writing method of the MRAM according to other example embodiments.

FIG. 6 is a circuit diagram of an array for explaining a second recording method (a second writing method) of the MRAM. FIG. 6 illustrates only two unit memory cells for convenience. Only a difference from the first writing method of FIG. 5 will be explained below.

Referring to FIG. 6, 0V is applied to the source line SL, and a second writing voltage (−Vw) is applied to the first and second bit lines BL1 and BL2. Accordingly, third and fourth electric currents I3 and I4 are created to flow from the source line SL, past the transistor 23 and the first and second MTJs 30 and 40, into the first and second bit lines BL1 and BL2. The amounts of the third and fourth electric currents I3 and I4 may be the same. However, the third electric current I3 flowing through the first MTJ 30 and the fourth electric current I4 flowing through the second MTJ 40 are running in opposite directions. Due to the third and fourth electric currents I3 and I4, the resistance states of the first and second MTJs 30 and 40 may be the opposite of the resistance states of FIG. 5. In other words, the first MTJ 30 has a relatively high resistance, and the second MTJ 40 has a relatively low resistance. As a result, bit data written on the first and second MTJs 30 and 40 of FIG. 6 may be the opposite from bit data written on the first and second MTJs 30 and 40 of FIG. 5.

Figure 7:
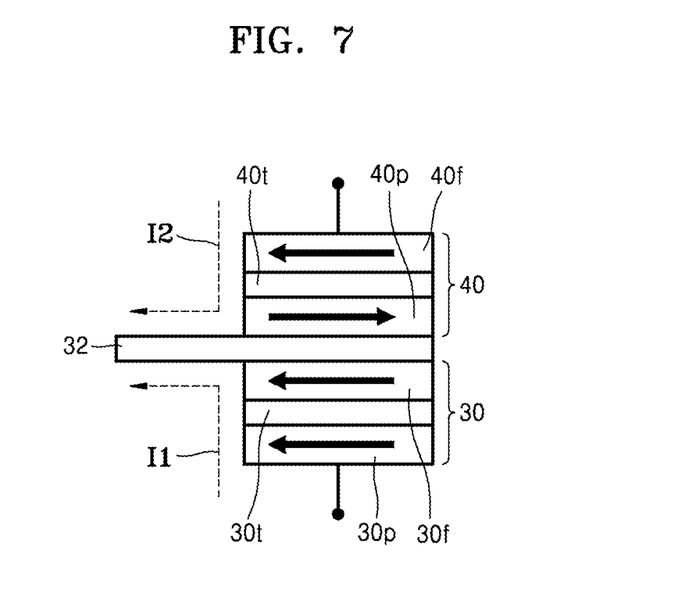
FIG. 7 is a cross-sectional view illustrating magnetization states of a first MTJ and a second MTJ in the writing method of FIG. 5.

FIG. 7 is a cross-sectional view illustrating resistance states of the first and second MTJs in the first recording method of FIG. 5.

Referring to FIG. 7, the free layer 30f and the pinned layer 30p of the first MTJ 30 have the same magnetization direction due to the first electric current I1. Accordingly, the first MTJ 30 has a relatively low resistance (On resistance). On the other hand, the free layer 40f and the pinned layer 40p of the second MTJ 40 have opposite magnetization directions as the second electric current I2 flows through the second MTJ 40 in the opposite direction to the first electric current I1. Accordingly, the second MTJ 40 has a relatively high resistance (Off resistance).

Figure 8:
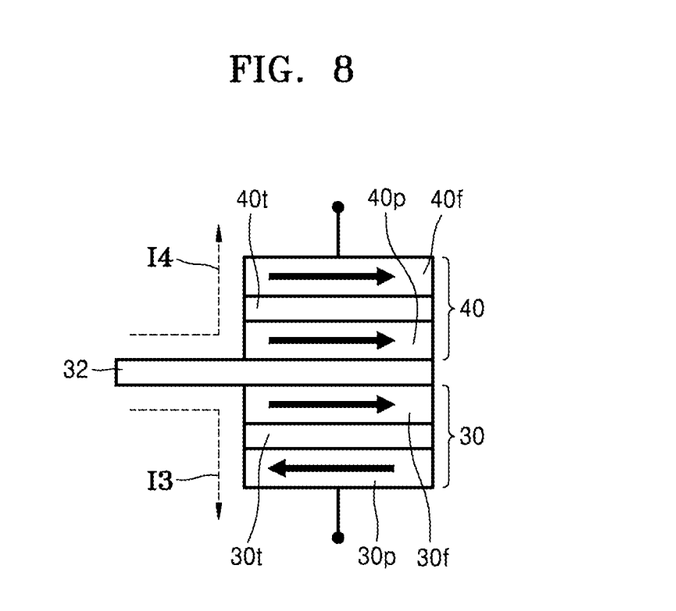
FIG. 8 is a cross-sectional view illustrating magnetization states of the first MTJ and the second MTJ in the writing method of FIG. 6.

FIG. 8 is a cross-sectional view illustrating resistance states of the first and second MTJs in the second recording method of FIG. 6.

Referring to FIG. 8, as the third electric current I3 flows through the first MTJ 30 in the opposite direction to the first electric current I1, the free layer 30f and the pinned layer 30p of the first MTJ 30 have opposite magnetization directions. Accordingly, the first MTJ 30 has a relatively high resistance (Off resistance). On the other hand, as the fourth electric current I4 flows through the second MTJ 40 in the opposite direction to the second electric current I2, the free layer 40f and the pinned layer 40p of the second MTJ 40 have the same magnetization direction. Accordingly, the second MTJ 40 has a relatively low resistance (On resistance).

As such, in any case, the first and second MTJs 30 and 40 have the opposite bit data recorded on each, thereby making one of the two MTJs 30 and 40 into On resistance, and the other one into Off resistance, which makes a resistance difference between the first and second MTJs 30 and 40 increased.

Figure 9:
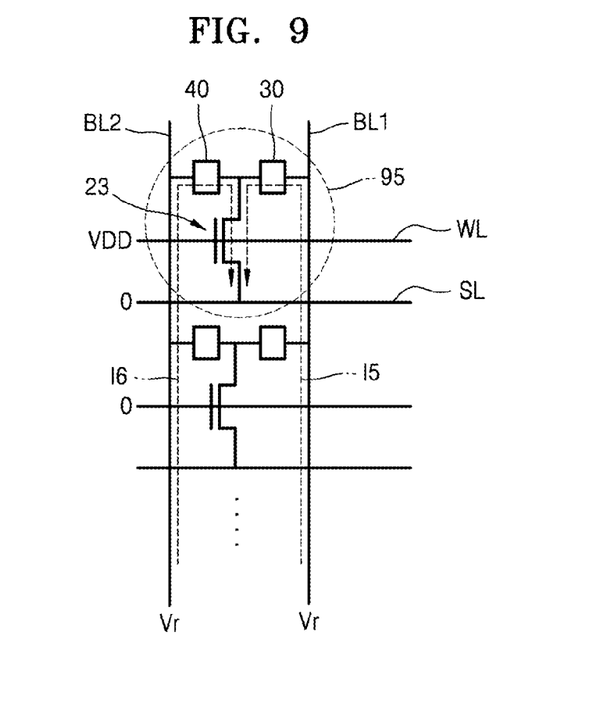
FIG. 9 is a circuit diagram of an array for explaining a reading method of the MRAM according to some example embodiments.

FIG. 9 is a circuit diagram of an array for explaining an operation method (reading method) of the MRAM according to some example embodiments. For convenience, only two unit memory cells are illustrated in FIG. 9. However, example embodiments are not limited thereto Referring to FIG. 9, 0V is applied to the source line SL, and an operating voltage (reading voltage) Vr is applied to only the first and second bit lines BL1 and BL2 that are connected to the selected memory cell 95. As a result, a potential difference is created between the first and second bit lines BL1 and BL2 and the source line SL, and fifth and sixth electric currents I5 and I6 flow from the first and second bit lines BL1 and BL2 toward the source line SL. The fifth and sixth electric currents I5 and I6 are operational currents to read the recorded data on the first and second MTJs 30 and 40. The fifth and sixth electric currents I5 and I6 may be smaller than the first to fourth electric currents I1-I4. Therefore, even though the fifth and sixth electric currents I5 and I6 pass through the first and second MTJs 30 and 40, resistance states of the first and second MTJs 40 and 50 are not changed, thereby keeping the data written on the first and second MTJs 30 and 40 intact.

Because the electric current that passed through the first MTJ 30 must be different from the electric current that passed through the second MTJ 40 based on the resistance state of the each MTJ, the data recorded on the first and second MTJs 30 and 40 may be distinguished by sensing the electric currents that passed through the first and second MTJs 30 and 40. By measuring the electric currents that passed through the first and second MTJs 30 and 40, the resistance difference between the first and second MJTs 30 and 40 may be measured. As explained, because the data is read by measuring the resistance difference between one MTJ having an On resistance state and the other MTJ having an Off resistance state, a sensing margin may be two times greater than that in a conventional way of reading data by measuring the On and Off resistance of one MTJ and then comparing the measured value with a reference value between the On/Off resistances. Furthermore, a reading operation is possible at a high speed by using a current sense amplifier.

Figure 10:
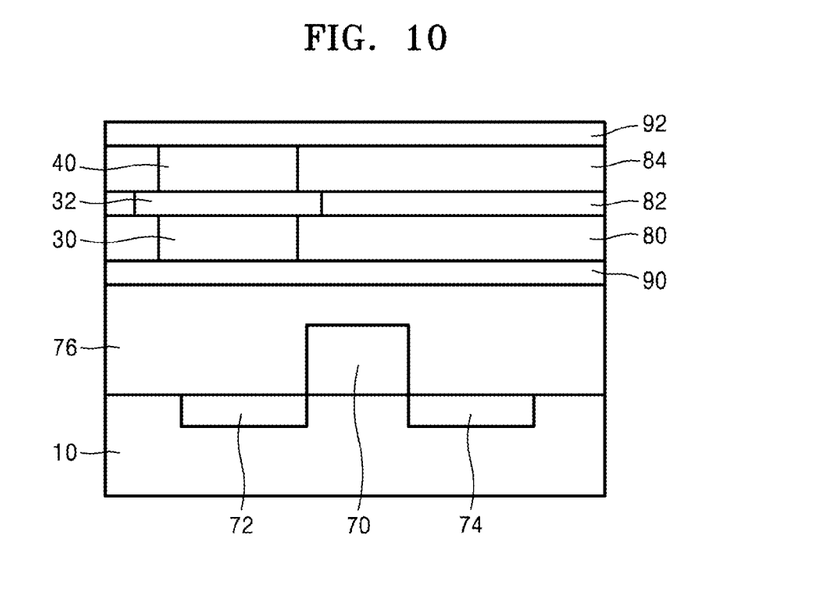
FIG. 10 is a cross-sectional view taken along line 10-10' of FIG. 3 for explaining a method of manufacturing the MRAM, according to some example embodiments.

A method of manufacturing the MRAM according to some example embodiments will be explained with reference to FIG. 10. FIG. 10 is a cross-sectional view taken along line 10-10' of FIG. 3.

Referring to FIG. 10, a gate stack structure 70 is formed on part of a substrate 10. The substrate 10 may be a semiconductor substrate doped with desired (or predetermined) impurities. For example, the substrate 10 may be a silicon substrate. The gate stack structure 70 may include a gate insulating film and a gate electrode which are sequentially stacked. First and second impurity regions 72 and 74 are formed on the substrate 10 on both sides of the gate stack structure 70. The first and second impurity regions 72 and 74 may be formed by using an ion implantation of conductive impurities. At this time, the conductive impurities may be an opposite type of the impurities doped in the substrate 10. For instance, if p-type impurities were doped in the substrate 10, the first and second impurity regions 72 and 74 may be formed through an ion implantation of n-type impurities. One of the first and second impurity regions 72 and 74 may be a source region (a source line), and the other impurity region may be a drain region. The first and second impurity regions 72 and 74, the gate stack structure 70 and the substrate 10 may constitute a field effect transistor. A first interlayer insulating layer 76 covering the field effect transistor is formed on the first substrate 10. The first interlayer insulating layer 76 may be formed of a well-known material such as borophosphosilicate glass (BPSG) or a silicon oxide film. The first wire 90 is formed on the first interlayer insulating layer 76. The first MTJ 30 is formed on the first wire 90. Then, a second interlayer insulating layer 80 which covers the first wire 90 and surrounds the first MTJ 30 is formed. The second interlayer insulating layer 80 may be the same as the first interlayer insulating layer 76. The conductive pad layer 32 is formed on the first MTJ 30. The conductive pad layer 32 may be connected to the first impurity region 72. A third interlayer insulating layer 82 surrounding the conductive pad layer 32 is formed on the second interlayer insulating layer 80. The third interlayer insulating layer 82 may be formed of the same material as the first interlayer insulating layer 76. The second MTJ 40 is formed on the conductive pad layer 32. At this time, the second MTJ 40 may be formed to be located right above the first MTJ 30. In this way, the first and second MTJs 30 and 40 are stacked vertically. The first and second MTJs 30 and 40 are independent from each other. The second MTJ 40 may be formed to have the same layer composition as the first MTJ 30. For example, the second MTJ 40 may be formed by sequentially stacking the pinned layer, the tunneling film, and the free layer, and the first MTJ 30 may be formed to have the same layer composition as the second MTJ 40. The first and second MTJs 30 and 40 may constitute one storage node. At this time, the conductive pad layer 32 may be included in the one storage node. Because the first and second MTJs 30 and 40 include magnetic layers, the storage node including the first and second MTJs 30 and 40 may be regarded as a magnetic node. A fourth interlayer insulating layer 84 which surrounds the second MTJ 40 is formed on the third interlayer insulating layer 82. The fourth interlayer insulating layer 84 may be formed of the same material as the third interlayer insulating layer 82. The second wire 92 is formed on the fourth interlayer insulating layer 84. The second wire 92 is formed to contact a top surface of the second MTJ 40.

Figure 11:
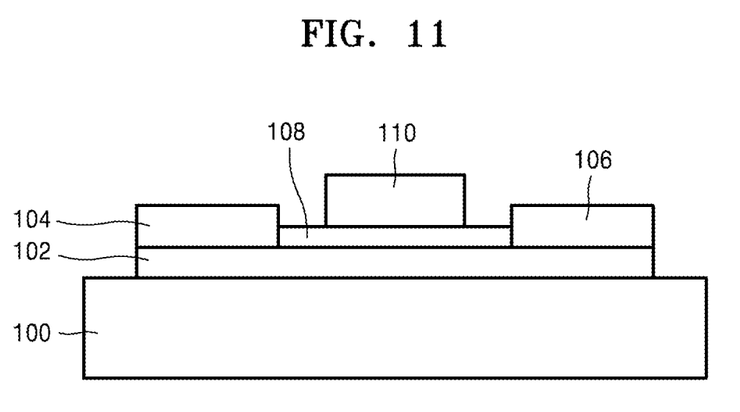
FIG. 11 is a cross-sectional view illustrating another transistor which may replace a transistor of FIG. 10.

On the other hand, the transistor including the substrate 10, the first and second impurity regions 72 and 74, and the gate stack structure 70 may be replaced by a transistor having a source and a drain on top of a channeling layer as illustrated in FIG. 11.

Referring to FIG. 11, a channel layer 102 is disposed on a substrate 100. First and second electrodes 104 and 106 that are separated from each other are formed on the channel layer 102. One of the first and second electrodes 104 and 106 may be a source electrode, and the other may be a drain electrode. A gate insulating film 108 is formed on the channel layer 102 that is disposed between the first and second electrodes 104 and 106. A gate electrode 110 is formed on the gate insulating film 108.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A magnetic random access memory (MRAM), comprising:
   a switching element;
   a storage node connected to the switching element, the storage node including a first magnetic tunnel junction (MTJ) and a second magnetic tunnel junction (MTJ);
   two bit lines, wherein the first MTJ and the second MTJ are between the two bit lines, and each of the first MTJ and the second MTJ are connected to a corresponding one of the two bit lines; and
   a conductive pad layer between the first MTJ and the second MTJ,
   wherein the first MTJ, the conductive pad layer, and the second MTJ are sequentially stacked between the two bit lines, and the first MTJ and the second MTJ simultaneously store two opposite bits.

2. The MRAM of claim 1, wherein
   the switching element is a field effect transistor, and
   the field effect transistor includes a source shared by a neighboring field effect transistor between the two bit lines.

3. The MRAM of claim 1, wherein the first MTJ includes a pinned layer, a tunneling film and a free layer,
   the pinned layer of the first MTJ contacts a first bit line of the two bit lines,
   the free layer of the first MTJ contacts the conductive pad layer,
   the second MTJ includes a pinned layer, a tunneling film and a free layer,
   the pinned layer of the second MTJ contacts the conductive pad layer, and
   the free layer of the second MTJ contacts a second bit line of the two bit lines.

4. The MRAM of claim 3, wherein
   the free layer and the pinned layer of the first MTJ are configured to have a same magnetization direction based on a first current applied to the first MTJ,
   the free layer and the pinned layer of the second MTJ are configured to have opposite magnetization directions based on a second current applied to the second MTJ, and
   the first current and the second current are applied simultaneously.

5. The MRAM of claim 1, wherein
   the field effect transistor includes a drain connected to the conductive pad layer.

6. A method of operating a magnetic random access memory (MRAM), the method comprising:
   applying an operational current to a storage node of the MRAM through two different paths,
   wherein the MRAM includes,
      a switching element,
      a storage node connected to the switching element, the storage node including a first magnetic tunnel junction (MTJ) and a second magnetic tunnel junction (MTJ),
      two bit lines, wherein the first MTJ and the second MTJ are between the two bit lines, and each of the first MTJ and the second MTJ are connected to a corresponding one of the two bit lines, and
      a conductive pad layer between the first MTJ and the second MTJ,
      wherein the first MTJ, the conductive pad layer, and the second MTJ are sequentially stacked between the two bit lines, and
      wherein the first MTJ and the second MTJ respectively store opposite first and second bit data.

7. The method of claim 6, wherein the operational current is a writing current for writing data on the magnetic node.

8. The method of claim 6, wherein the operational current is a reading current for reading data from the magnetic node.

9. The method of claim 6, wherein
   the applying of the operational current to the storage node of the MRAM includes applying a first current in a first direction through the first MTJ, and applying a second current in a second direction through the second MTJ, and
   the first direction is opposite to the second direction.

10. The method of claim 9, wherein
    the operational current is applied simultaneously through the two different paths.

* * * * *